(12) United States Patent
Jakob (10) Patent No.: US 8,911,583 B2
(45) Date of Patent: Dec. 16, 2014

(54) METHOD FOR PROCESSING, IN PARTICULAR, THIN REAR SIDES OF A WAFER, WAFER-CARRIER ARRANGEMENT AND METHOD FOR PRODUCING SAID TYPE OF WAFER-CARRIER ARRANGEMENT

(75) Inventor: Andreas Jakob, Starnberg (DE)

(73) Assignee: Thin Materials AG, Eichenau (DE)

( * ) Notice: Subject to any disclaimer, the term of this patent is extended or adjusted under 35 U.S.C. 154(b) by 1184 days.

(21) Appl. No.: 12/280,758

(22) PCT Filed: Mar. 1, 2007

(86) PCT No.: PCT/EP2007/051952
§ 371 (c)(1),
(2), (4) Date: Oct. 15, 2009

(87) PCT Pub. No.: WO2007/099146
PCT Pub. Date: Sep. 7, 2007

(65) Prior Publication Data
US 2010/0043608 A1 Feb. 25, 2010

(30) Foreign Application Priority Data

Mar. 1, 2006 (DE) .......................... 10 2006 009 353
Mar. 1, 2006 (DE) .......................... 10 2006 009 394
Oct. 16, 2006 (DE) .......................... 10 2006 048 799
Oct. 16, 2006 (DE) .......................... 10 2006 048 800

(51) Int. Cl.
| | |
|---|---|
| *B32B 38/10* | (2006.01) |
| *H01L 21/67* | (2006.01) |
| *H01L 21/683* | (2006.01) |
| *H01L 21/78* | (2006.01) |

(52) U.S. Cl.
CPC . *H01L 21/67132* (2013.01); *H01L 2221/68363* (2013.01); *H01L 2221/68331* (2013.01);
(Continued)

(58) Field of Classification Search
USPC ........ 156/247, 280, 272.2, 150, 272.4, 273.1, 156/289, 715, 276.6
See application file for complete search history.

(56) References Cited

U.S. PATENT DOCUMENTS 6,071,795 A * 6/2000 Cheung et al. ................ 438/458
6,202,299 B1 3/2001 DiStefano et al.
(Continued)

FOREIGN PATENT DOCUMENTS

CN 1668715 A 9/2005
DE 10353530 6/2005
(Continued)

OTHER PUBLICATIONS

C.R. Mrskys et al. (Freestanding GaN-substrates and devices Phys. Stat. Sol. (c) 2003, No. 6) pp. 1627-1650.*

(Continued)

*Primary Examiner* — Margaret Squalls
(74) *Attorney, Agent, or Firm* — Novak Druce Connolly Bove + Quigg LLP (57) ABSTRACT

The present patent application relates to a wafer support arrangement, comprising
  a wafer (1),
  a support layer system (5, 6) and
  a separating layer (4), which is arranged between the support layer system (5, 6) and the wafer (1),
wherein the support layer system (5, 6)
(i) comprises a support layer (6) and
(ii) a layer (5) from a through hardened, partially hardened or hardenable elastomer material on the separating layer side or consists of these two layers and
wherein the separating layer (4)
(iii) is a plasma polymer layer and
(iv) the adhesive bond between the support layer system (5, 6) and the separating layer (4), after the elastomer material has through hardened, is greater than the adhesive bond between the wafer (1) and the separating layer (4).

19 Claims, 3 Drawing Sheets

(52) U.S. Cl.
CPC ..... *H01L 21/6835* (2013.01); *H01L 2221/6834* (2013.01); *H01L 21/6836* (2013.01); *H01L 21/78* (2013.01); *H01L 2221/68327* (2013.01); *H01L 2221/68395* (2013.01)
USPC .......... 156/247; 156/280; 156/60; 156/272.2; 156/272.6; 156/150

(56) References Cited

U.S. PATENT DOCUMENTS

| | | | |
|---|---|---|---|
| 6,393,759 B1* | 5/2002 | Brown et al. | 43/113 |
| 6,923,881 B2* | 8/2005 | Tateishi et al. | 156/240 |
| 2001/0024118 A1 | 9/2001 | Farnworth et al. | |
| 2004/0188861 A1 | 9/2004 | Kurimoto et al. | |
| 2005/0098261 A1* | 5/2005 | Tachino et al. | 156/273.3 |
| 2005/0118443 A1* | 6/2005 | Lee et al. | 428/480 |
| 2006/0055314 A1* | 3/2006 | Nakamura et al. | 313/500 |
| 2006/0057779 A1* | 3/2006 | Sutoh et al. | 438/118 |
| 2006/0166464 A1* | 7/2006 | Jakob et al. | 438/460 |

FOREIGN PATENT DOCUMENTS

| | | |
|---|---|---|
| EP | 1592058 | 11/2005 |
| JP | 2003332267 A | 11/2003 |
| JP | 200553998 A | 3/2005 |
| JP | 2006508540 A | 3/2006 |
| WO | WO-2004007628 | 1/2004 |
| WO | WO 2004051708 A2 * | 6/2004 |

OTHER PUBLICATIONS

Chinese Office Action dated Feb. 2, 2010 issued in counterpart Application No. 200780007194.6, including English language translation.

Japanese Patent Office. Japanese Office Action dated Dec. 5, 2011, Japanese Patent Application No. 2008-556786. Japanese Language. 3 pages.

Japanese Patent Office. Japanese Office Action dated Dec. 5, 2011, Japanese Patent Application No. 2008-556786. English Language Translation. 6 pages.

* cited by examiner

METHOD FOR PROCESSING, IN PARTICULAR, THIN REAR SIDES OF A WAFER, WAFER-CARRIER ARRANGEMENT AND METHOD FOR PRODUCING SAID TYPE OF WAFER-CARRIER ARRANGEMENT

CROSS-REFERENCE TO RELATED APPLICATIONS

This application claims benefit of priority to PCT/EP2007/051952, filed on Mar. 1, 2007 and published as WO2007/099146 on Sep. 7, 2007, which asserts priority to DE 10 2006 009 394.1, filed on Mar. 1, 2006; to DE 10 2006 009 353.4, filed on Mar. 1, 2006; to DE 10 2006 048 800.8 filed on Oct. 16, 2006; and to DE 10 2006 048 799.0 filed on Oct. 16, 2006, which are incorporated herein by reference in their entireties.

The present invention relates to a wafer support arrangement, comprising a wafer, a support layer system and a separating layer, which is arranged between the support layer system and the wafer, and a layer system for such a wafer support arrangement. The invention also relates to the use of such a wafer support arrangement for processing the rear side of a wafer, preferably for thinning and/or slicing the wafer, as well as a method for producing such a layer system, a method for producing such a wafer support arrangement as well as a method for processing the rear side of a wafer, in particular for thinning the rear side of a wafer and/or for slicing a wafer.

At present there is a high requirement for as thin as possible electronic elements and circuits. In the production of such electronic elements and circuits (diodes, transistors, ICs, sensors etc.) structures and layers for producing the desired electronic functions are applied on wafers (possibly doped slices made from silicon, gallium arsenide etc.) are applied by means of different technologies. At present these wafers, after the production steps necessary for these have been completed, are provided with a protective foil or other protective layer on the front (that is the active side or the side, on which the applied structures are located). The object of this foil or layer is to protect the wafer front and in particular the electrical and mechanical structures applied thereon during subsequent thinning and/or other processing of the rear side of the wafer. Thinning takes place via techniques such as grinding, honing, polishing, etching or the like of the rear side of the wafer.

The aim of this procedure is to reduce the original thickness of the wafer. The extent of reduction is crucially determined by the mechanical and thermal stresses to be expected during thinning and/or further subsequent process steps: since the wafer, if it is thinned, has already passed through a number of process steps, it already represents a high commercial value. Therefore the risk of breaking the wafer must be kept to a minimum. Accordingly, thinning to the extent actually desired is often not possible, since otherwise losses which are too big arise as a result of the wafer breaking.

In accordance with the prior art after the wafer has been thinned frequently the rear side of the wafer is chemically treated in order to improve the breakage properties. After possible cleaning steps the protective foil is peeled off from the wafer topside or otherwise removed. Further production steps and/or measures can now follow in order to improve the characteristics of the wafer as well as investigations e.g. for quality control. Often the rear side of the thinned wafer is coated with a metallic layer. This coating process normally takes place by means of sputtering or similar vacuum deposition methods and often causes thermal stress.

Afterwards the rear side of the wafer (active side upwards) is laid down onto a sawing foil, expansion foil or frame. Subsequently the wafer is sliced, that is to say the wafer is divided into sliced components (microchips, dies). This slicing frequently takes place by means of rotary separation disks or other mechanical sawing devices. In addition laser separation processes are used. Alternatively the wafers are also broken during slicing, wherein auxiliary processes such as notching are sometimes used.

For the reasons mentioned it is very difficult with conventional methods to process or produce very thin wafers. These difficulties arise among other things because the wafer must be exposed during and after thinning to mechanical stresses. These stresses occur inter alia:

during thinning of the wafer, wherein the wafer if it is thinned to a very high degree, is inclined to become corrugated, while peeling off the protective foil or the protective layer, which protects the wafer front during thinning, while laying the wafer onto the sawing foil and during transport between individual production steps, in particular however while coating the rear side, wherein at the minimum thermal stresses also arise if the rear side coating takes place after the wafer has already been sliced.

Alternatively to the methods mentioned, today methods are also used, in which the wafer front is already structured before the thinning process by means of grinding notch structures, notching, chemical etching, plasma etching of grooves and/or structures, such that during the subsequent thinning process these structures are obtained from the rear side by means of mechanical and/or chemical methods so that the wafer is sliced.

An alternative to the aforementioned techniques for thinning and further processing of the wafer is disclosed in the published unexamined German Patent DE 103 53 530 and World Patent WO 2004/051708: in these patents a separating layer and a support layer are proposed for thinning and further processing of the wafer wherein the separating layer is a plasma polymer layer, which adheres more strongly to the support layer than to the wafer. As a result of the adhesive bond or de-adhesive bond properties of the plasma polymer layer, which can be adjusted by the person skilled in the art on the basis of the plasma polymerisation process, it is possible to configure the layer in such a way that this has a greater adhesive bond with the support layer than with the wafer. In this case the adhesive bond to the wafer can be adjusted in such a way that a very thin wafer can also be removed from the separating layer (and the support layer) without too high mechanical stresses arising.

It is a disadvantage with the methods disclosed in the documents mentioned that the support layer proposed there is not adapted to the optimum: in particular with three-dimensionally structured wafer surfaces (like for example wafers provided with bumps or wafers with undercuts on their surface) the proposed support layer is too hard (for example polyimide or polyamide): since the plasma polymer separating layer covers the surface structures of the wafer substantially with a constantly thick layer, gaps such as undercuts or gaps between the bumps should be filled in by the material for the support layer. If this is the case however, due to the hardness of the support layer, it also means that the support layer cannot be removed from the wafer again without destruction. If the support layer does not fill in the surface structures, cavities remain, which can negatively affect adhesion between support and separating layer and lead to unwanted inclusions. Due to different heat expansion coefficients of support layer and wafer additional mechanical stress is also generated on the wafer.

Therefore it was the object of the present invention to indicate an improved layer system in particular with respect to support layer formation.

According to the invention this object is achieved by a wafer support arrangement, comprising
- a wafer,
- a support layer system and
- a separating layer, which is arranged between the support layer system and the wafer,
- wherein the support layer system
  (i) comprises a support layer and
  (ii) a layer from a through hardened, partially hardened or hardenable elastomer material on the separating layer side or consists of these two layers and
  wherein the separating layer
  (iii) is a plasma polymer layer and
  (iv) the adhesive bond between the support layer system and the separating layer, after the elastomer material has through hardened, is greater than the adhesive bond between the wafer and the separating layer.

Elastomer material in this text, besides the elastomers already fully polymerized, is also their low-molecular preliminary stages (as far as the monomers). It can concern low-molecular liquids or paste-like materials, which are not yet or only partially cross-linked.

Accordingly hardenable elastomer materials in the context of this text are commercially available preliminary stages for polymer elastomers. Partially hardened elastomer material in connection with this text is hardenable elastomer material, which has already been subjected to polymerisation/cross-linking, wherein however polymerisation/cross-linking is not yet complete and/or further polymerisation/cross-linking can possibly take place by an alternative chemical or physical mechanism. Through hardened elastomer material in the context of this text is elastomers, whose polymerisation/cross-linking is substantially complete. Here it is to be noted that with completion of polymerisation/cross-linking what is meant is that the elastomer in the classical sense is present.

A "plasma polymer layer" in the context of this text is a layer, which is producible by means of plasma polymerisation. Plasma polymerisation is a method, wherein gaseous precursors (often also known as monomers), excited by a plasma, are deposited on a freely selectable substrate as a highly cross-linked layer. A condition for plasma polymerisation is the presence of chain-forming atoms such as carbon or silicon in the process gas. As a result of the excitement, the molecules of the gaseous substance (precursors) are fragmented by bombardment with electrons and/or highly energetic ions. In this case highly excited radical or ionic molecule fragments, which react with each other in the gas area and are deposited on the surface to be coated, are produced. The electrical discharge of the plasma and its intensive ion and electron bombardment act constantly on this deposited layer so that further reactions are triggered in the deposited layer and high-grade cross-linkage of the deposited molecules can be achieved.

In the context of the present text the term "plasma polymer layer" also includes layers, which can be produced by means of plasma-assisted CVD (PE-CVD). In this case the substrate is additionally heated up for controlling the reaction. Thus for example $SiO_2$ coatings can be produced from silane and oxygen. Furthermore it is expressly mentioned that atmospheric pressure plasma processes can also be used for the production of plasma polymer layers to be used according to the invention, although low pressure plasma polymerisation processes are preferred at present.

In the context of the present text substances, which for layer formation are fed as gas or vapour to a plasma by means of plasma polymerisation, are called "monomers" (gaseous precursors). Liquids, which can be cross-linked for example by the action of a plasma (for example by highly excited particles, electrons or UV radiation) without prior evaporation, are known as "liquid precursors".

Plasma polymers layers are clearly differentiated from polymer layers in their microscopic composition. While in the case of polymers the curing process of the monomers takes place in a predictable way, in the case of plasma polymerisation the monomers used are greatly altered by contact with the plasma (as far as complete destruction) and deposited in the form of reactive species, so that a highly cross-linked layer results, without regularly repetitive areas. Accordingly plasma polymerisation in the sense of this text differs from plasma-induced polymerisation. This also applies to so-called "structure-forming plasma polymerisation", since even in the case of "mild" plasma conditions unpredictable molecule breakages arise.

In WO 2004/051708 A2 mentioned above plasma polymer layers suitable for the present invention are disclosed. The published unexamined patent mentioned is incorporated here in this text by way of reference. This applies in particular to the data from WO 2004/051708 A2 for producing the plasma polymer separating layer and for the separating layer itself.

Plasma polymer separating layers, likewise applicable to the present invention, are also disclosed by the German Patent DE 100 34 737 C2. Here however it is to be considered that the more strongly de-adhesive acting surface of the plasma polymer separating layer disclosed there must be aligned to the wafer and therefore when the plasma polymer separating layer is deposited on the wafer, the reaction control for the plasma process accordingly has to be carried out conversely to the way disclosed in DE 100 34 737 C2. With this proviso the disclosure content of DE 100 34 737 C2, in particular with respect to the deposit processes and the plasma polymer separating layer itself is also incorporated here in the present patent application text by way of reference.

The person skilled in the art can determine the adhesive bond between the respective layers according to DIN 971-1 1996-09: and it is defined as "all the cohesive forces between a coating and its substrate".

The advantage of the wafer support arrangement according to the invention consists of the fact that an ideal bond between the support layer and possibly the separating layer, which is on the wafer, can be produced due to the properties of the elastomer material (flexibility, elasticity). In particular the adhesive bond between the plasma polymer layer and the layer from elastomer material can be adjusted in such a way that if there is separation between the support layer system consisting of support layer and layer from elastomer material and the wafer, the separating layer remains adherent to the elastomer layer. At the same time separation from the wafer is entirely possible even with three-dimensional surface structures such as bumps and undercuts present on the wafer.

The elastomer layer has the further advantage that it is able within certain limits to balance out tensions, which arise due to different heat expansion coefficients for the linear expansion between the support layer used in each case and the wafer. A further substantial advantage of the elastomer layer consists of the fact that with sufficient thickness it prevents elevations on the wafer front, for example bumps due to mechanical stress that arises during thinning of the wafer, from being forced through onto the wafer, so that defects develop and in extreme cases the wafer may be destroyed.

The selection of the elastomer material and the adaptation of the plasma polymer separating layer both to this material and to the wafer surface present in each case are significant for the present invention. The person skilled in the art adapts the plasma polymer separating layer by suitable process control during the plasma polymer deposition process (or also PE-CVD process). In this case the plasma polymer separating layer provides the necessary adhesion characteristics so that the wafer support arrangement can be easily handled with the layer system applied. This also applies in particular to handling during thinning. On the other hand the support layer system must be able to be removed in a suitable way from the wafer. The configuration of the plasma polymer separating layer mentioned with respect to its adhesive bond leads to the fact that a predetermined break point is provided between the wafer surface (which likewise can also comprise a further layer, for example a passivation layer) and the separating layer. In this case the ease of handling before separation (or the stresses arising here) and the stress tolerances of the wafer after thinning during the separation are crucial for the adhesion characteristics of this predetermined break point.

Also the layer from elastomer material naturally plays an important role: the hardness of the elastomer material must be such that the material is soft enough to also encapsulate a structured wafer surface preferably without cavities (wherein the structure-reproducing separating layer can already be present on the structure of the surface). In addition the silicone material must be hard enough or convertible into a sufficiently hard state to ensure the ease of handling of the wafer support arrangement after the support layer system has been applied to the wafer surface (indirectly, since the plasma polymer separating layer is arranged between wafer surface and separating layer system). In particular the elastomer layer must be strong enough within itself so that separation takes place between wafer and plasma polymer separating layer and the elastomer layer for instance does not tear inside itself.

For the person skilled in the art it is naturally easy to understand that the adhesive bond of the two layers forming the support layer system (support layer and layer from a through hardened, partially hardened or hardenable elastomer material) must be greater to each other than the adhesive bond between the separating layer and the wafer.

In the case of the structure of the wafer support arrangement according to the invention the elastomer material, as previously mentioned, must be soft enough, in order to completely encapsulate the topography of the wafer surface. This can be achieved for example if the hardenable elastomer material is applied as liquid by way of spin or spray coating or other technologies suitable for applying liquid materials onto a wafer coated with a plasma polymer separating layer. Subsequently the liquid hardenable elastomer material must be through hardened so that it can fulfil its function. Alternatively it is also possible to apply the hardenable or partially hardened elastomer material onto a support layer and possibly to partially harden it to such a degree that a gel-like consistency develops. Of course a number of options are available to the person skilled in the art for bonding the support layer to the layer from elastomer material, which for example ranges from gluing, through vulcanizing to thermo compression. Here the person skilled in the art selects the suitable method dependent upon the materials used in each case.

As soon as the support layer system is produced, it can be bonded to the wafer on which the plasma polymer separating layer has been deposited. This can take place for example by means of thermo compression, where however other physical and/or chemical adhesion-producing techniques can also be used. The person skilled in the art, as a function of the material actually used both for the separating layer and for the layer from elastomer material also selects the corresponding method here. In addition the person skilled in the art in this case considers the state, in which the elastomer material will be found if the separating layer is to be separated from the wafer. This is particularly important if the elastomer material is not yet completely through hardened—which is a preferred variant—if it is bonded to the (plasma polymer-coated) wafer surface.

For the person skilled in the art it is naturally easy to understand that with a plasma polymer separating layer, which possesses sufficient flexibility and expandability, the plasma polymer separating layer can also be deposited on the layer from hardenable elastomer material. In this case in a subsequent step the support layer system, which comprises the plasma polymer layer on the side turned away from the support layer, would only be bonded to the wafer by suitable adhesion-producing methods. Here also it is again crucial that the possibly structured wafer surface is fully encapsulated. In particular the person skilled in the art will ensure that when producing the wafer support arrangement according to the invention a total surface area distribution of the layer from elastomer material with respect to the wafer surface takes place and the layer system is produced as far as possible, preferably completely, without inclusions of air or cavities. This can be achieved in a preferred variant of the invention in particular if the hardenable elastomer material and/or the partially hardened elastomer material of the layer from elastomer material is sufficiently "liquid" that it encapsulates the structures in the wafer surface (indirectly due to the plasma polymer separating layer). Subsequently through hardening can then take place. Naturally laminating can also take place under vacuum conditions.

The hardenable elastomer material or the partially hardened elastomer material is through hardened by a way suited to the material, which can be selected by the person skilled in the art for example by supplying or extracting energy in the form of heat or by suitable chemical reactions, like for example polymerisation and/or vulcanisation.

The person skilled in the art naturally understands that the layer from elastomer material does not need to consist entirely of this material and can also include additives. In this case however the mechanical characteristics are substantially influenced by the elastomer material: the layer is of course especially preferably after through hardening the layer still an elastomer layer as before.

For the person skilled in the art it is easy to understand that the wafer support arrangement according to the invention can also comprise further layers like for example an adhesive layer between the support layer and the layer from elastomer material. Finally it is crucial that the layers mentioned can fulfil their function in each case, that is to say in particular:

that the adhesive bond between the separating layer and the wafer represents the minimum adhesive bond between two layers in the entire layer system, so that the predetermined break point is provided between separating layer and wafer,     that the layer from elastomer material when the layer system is bonded to the wafer has a consistency, which guarantees that the surface structures of the wafer are encapsulated to the necessary degree,     that the layer from elastomer material after hardening sufficiently stabilizes the layer system for further processing of the wafer, and that in particular it is stable enough for the layer from elastomer material not to tear when the wafer is removed from the separating layer (or vice versa) and that the support layer sufficiently stabilizes the wafer support arrangement.

Under certain circumstances the layer from elastomer material can also take over the function of the support layer.

Finally the wafer support arrangement according to the invention under the aforementioned conditions enables the rear side of the wafer to be processed substantially more easily, since handling is simple and a suitable stabilization layer system is present. In particular it is possible to thin the wafer to a greater degree since relatively lower (and through selection of the plasma polymer layer to a large extent controllable) mechanical stress arises, due to the plasma polymer separating layer, when the wafer is separated from the layer system.

With respect to the separating layer it is again remarked that it is naturally understandable for the person skilled in the art that it is not essential that the plasma polymer separating layer is deposited either on the wafer or on the layer from elastomer material. In theory the separating layer can also be initially produced independently of the wafer and the layer from elastomer material and subsequently bonded to these for example by thermo compression. It is however preferable to deposit the separating layer on the wafer surface since in this way the reproduction of the wafer surface contour is optimally ensured by the plasma polymer separating layer.

A wafer support arrangement according to the invention, comprising a connecting material layer and a second support layer on the side, turned away from the separating layer, of the wafer (rear side of the wafer), is also preferred.

It is easy to understand that the wafer support arrangement just described is naturally only produced after the rear side of the wafer has been processed. It is to be stressed that the second support layer can be completely different in terms of material from the first support layer. The connecting material layer serves to bond the second support layer to the wafer. For this material, which can be configured differently, it is crucial that in a suitable way it ensures a peelable bond between the second support layer and the wafer. Thus the connecting material layer for example can be a layer from a UV or thermal release adhesive, which reduces or loses its adhesive bond if it is UV-irradiated or under the influence of thermal energy. Preferably it is natural in this regard that as little as possible, particularly preferably nothing, remains of the connecting material layer on the wafer after the adhesion has been reduced accordingly. Possibly the connecting material layer for its part can represent a plasma polymer separating layer, which possesses greater adhesion to the second support layer than to the wafer.

The advantage of this second support layer can be that it facilitates handling of the thinned and/or sliced wafers as well as possibly permits or assists separation of the layer system on the wafer front from the wafer (see below also, in regard to this).

Part of the invention is also a support layer system for a wafer support arrangement according to the invention, comprising (i) a support layer,
(ii) a layer from a through hardened, partially hardened or hardenable elastomer material and
(iii) a peelable protective foil on the side, turned away from the support layer, of the layer from elastomer material.

A peelable protective foil in this context is a foil, which can be removed in a mechanical way from the elastomer material without residue.

The support layer system according to the invention described represents a preliminary stage of the wafer support arrangement according to the invention and is intended to be used to produce the wafer support arrangement according to the invention. This can take place by removing the peelable protective foil and afterwards thermo compressing the support layer system with the wafer already provided with a plasma polymer separating layer, or otherwise bonding thereto in a suitable way.

In particular an advantage of this support layer system is the fact that, due to the protective foil, it is easily storable and transportable and also can be produced at a location remote from wafer production and processing.

Part of the invention is also a layer system for a wafer support arrangement according to the invention, comprising
(i) a support layer,
(ii) a layer from a through hardened, partially hardened or hardenable elastomer material and
(iii) a plasma polymer separating layer, on the side turned away from the support layer, of the layer from elastomer material,
wherein a protective foil, which is applied to the side turned away from the support layer of the plasma polymer separating layer, is preferably also provided here.

If the pre-conditions, which were described further above apply to the plasma polymer separating layer, this product can also be used outstandingly to produce a wafer support arrangement according to the invention. Again the advantages that the layer system may be produced separately and can already be used as a pre-product also exist here.

Part of the invention is also a wafer support arrangement according to the invention or a layer system according to the invention wherein the elastomer material, in the partially hardened condition, preferably possesses a significantly lower Shore-A-hardness than in the through hardened condition with a typical Shore-A-hardness from 15 to 78, preferably 20 to 70, more preferably 30 to 60 and particularly preferably 40 to 55.

A significantly lower Shore-A-hardness for the partially hardened condition is understood to mean a Shore-A-hardness, which is at least 10%, preferably 20% and particularly preferably 40% lower than that for the through hardened condition. For many applications it is particularly preferable that practically no Shore-A-hardness is present in the partially hardened condition, since the elastomer material is (still) not a fully hardened body with a Shore-A-hardness in the classical sense, but is present in a pasty, possibly even liquid state.

As described further above the partially hardened condition of the layer from elastomer material serves to impart a suitable consistency to the elastomer material so that it encapsulates the wafer surface topography (covered by a plasma polymer separating layer) to a sufficient degree, but on the other hand does not flow randomly while laminating.

The partially hardened condition of the elastomer material can be produced in different ways: if the through hardening (for example polymerisation) of the elastomer material is thermally controlled, thermal energy is only fed to the elastomer material for such a time until the desired partially hardened condition is reached. Possibly a corresponding through hardening (polymerisation) reaction can also be interrupted by controlled withdrawal of heat, like for example chilling, or slowed down to the desired extent. This applies in particular if the through hardening reaction is only induced by heat.

As an alternative it is possible to use elastomer materials, which can be through hardened by means of two mechanisms (polymerisation and/or cross-linking). This can be achieved for example by providing different reactive groups in the hardenable elastomer material: thus for example it is possible firstly to allow hardening/polymerisation/cross-linking by UV radiation to finish and only start the second reaction mechanism, for example a chemical mechanism, after the wafer surface has been contacted (naturally promoted by the plasma polymer separating layer).

For many applications it can also be preferable to use a hardenable elastomer material which, during the through hardening process or at least during parts of the through hardening process, is dependent on constant energy input (for example light/UV radiation/heat), in order to maintain the through hardening process.

Preferred according to the invention is a wafer support arrangement according to the invention or a layer system according to the invention, wherein the elastomer material is produced on a silicone basis or on the basis of a material, which with respect to its characteristics is similar to silicone.

The characteristics, which are important in this context, are especially mechanical strength, temperature resistance, vacuum compatibility and low chemical reactivity with other materials.

Preferred materials for the elastomer material are silicone elastomers, rubber and materials similar to rubber.

Also preferred is a wafer support arrangement according to the invention or a layer system according to the invention, in which the support layer is a polyimide or polyamide layer, preferably in the form of a Capton or Ultem foil, a glass layer or a silicon layer.

A wafer support arrangement according to the invention is particularly preferred, wherein the heat expansion coefficient at 20° C. for the linear expansion of the support layer differs from that of the wafer by maximum $10.0*10^{-6}/°$ C., preferably maximum $5*10^{-6}/°$ C., more preferably maximum $2.5*10^{-6}/°$ C., particularly preferably maximum $1.8*10^{-6}/°$ C.

The advantage of the latter wafer support arrangement according to the invention consists in that by selecting the material for the support layer based on the heat expansion coefficient, it is ensured that little or preferably no mechanical stress, caused by the differing expansion of the materials, arises between the wafer and the support layer.

Accordingly glass or modified glass, which with respect to its heat expansion coefficient possesses only minor differences from the heat expansion coefficient of the wafer, is preferred for the support layer or the same material, from which the wafer is substantially formed. Ideally in this case glass such as Borofloat 33 supplied by Planoptik, which at an ambient temperature of 20° C. has a heat expansion coefficient of $3.2*10^{-6}/°$ C. is used, in order therefore to come very near to the heat expansion coefficient of the silicon.

Particularly preferred however in this context is a glass adapted accordingly with respect to its heat expansion coefficient, since as a rule this can be relatively cost-effective and furthermore can also be permeable for light and/or UV radiation, by means of which the layer from elastomer material can be (partially) through hardened.

Also preferred is a wafer support arrangement according to the invention, wherein the second support layer is a foil and particularly preferred, wherein the pliancy of the second support layer is greater than that of the first.

A pliancy comparison is carried out as follows: in each case for comparing the pliancy of the two layers from the material, of which the layers consist, a body of identical length and width and in each case with the height of the respective layer thickness is produced. Preferably this body is elongated. Subsequently one end of the body is fixed, while a defined force is exerted at the other end. That body, which suffers a greater (flexible) deflection from the original plane by the force exerted on the non-fixed end, possesses the greater pliancy. The pliancy expressly relates to flexible deformation and not to non-flexibility, for example buckling.

In particular if the support layer consists of a less flexible/less pliable material, for example glass, it is advantageous for mechanical release of the wafer from the separating layer, if the (thinned) wafer as well as the layer system on its rear side can be bent, so that on the one hand the wafer is protected on its rear side by the support layer, on the other hand however so that mechanical shear stresses arise, which facilitate the release of the bond between wafer and separating layer. Of course the separation process can be assisted by a mechanical aid, for example a reverse roller (see below in this connection) and it is additionally advantageous to fix the support layer.

Particularly preferred materials for the second support layer in this context are foils consisting of one or more layers of PP, PE, PET and/or other plastics. Preferably the materials for the second support layer can be expanded. Examples of such foils are sawing foils (in the industry also usually known as "bluetape"), as sold by manufacturers such as Lintec or Nitto.

Preferred is a wafer support arrangement according to the invention with a second support layer, wherein the connecting material layer comprises a material, preferably an adhesive, or consists of this, which preferably reduces or loses its adhesion to the wafer under the effect of radiation and/or heat.

This preferred connecting material layer in turn facilitates preferably residue-free separation of the second support layer from the wafer. This separation takes place regularly after separation between wafer and the plasma polymer separating layer. Finally in this way the wafer can be obtained without the layer system provided for processing.

For many applications a wafer support arrangement according to the invention or a layer system according to the invention is preferred, wherein the support layer and/or the layer made from elastomer material and/or the second support layer are configured so that they can be electrostatically charged and/or can be fixed by electrostatically charged surfaces.

For the preferred arrangement (electrostatic rechargeability) of the corresponding layers a number of options is available to the person skilled in the art. On the one hand the desired effect can be achieved by the selection of the (main) material for the respective layer or by introducing corresponding electrostatically rechargeable particles in one or more of the layers mentioned.

The advantage of this preferred embodiment of the invention lies in the fact that interactions with electrostatically charged surfaces can be generated by means of the electrostatic properties of the layers and the wafer support arrangement according to the invention can be fixed (e.g. for transport). Of course it can also be retained for different processes e.g. thinning or metallizing of the rear side. Electrostatic fixing is especially advantageous for processing under vacuum conditions.

According to the invention a layer system according to the invention with a protective foil is preferable, wherein the protective foil for example can be a silicone-coated paper or a foil consisting of PP, PE, PET or another plastic. The overriding feature of the foil is that it can be easily removed again preferably without residue from the elastomer layer of the support.

Part of the invention is also the use of a layer from a through hardened elastomer material and a plasma polymer separating layer and/or a layer system according to the invention and/or a wafer support arrangement according to the invention for processing the rear side of a wafer, preferably for thinning and/or slicing a wafer.

Part of the invention is also the use of a layer system according to the invention to produce a wafer support arrangement according to the invention.

Furthermore part of the invention is a method for producing a layer system according to the invention, comprising the steps:
a) formation of a support layer,
b) formation of a layer from hardenable elastomer material,
c) bonding of the layers produced in step a) and b), preferably at the same time with step a) or b),
d) possible through hardening or partial hardening of the layer from hardenable elastomer material,
e) possible deposition of a plasma polymer separating layer on the side, turned away from the support layer, of the layer from elastomer material and
f) possible application of a peelable protective foil on the side, turned away from the support layer, of the layer from elastomer material or on the side, turned away from the support layer, of the plasma polymer separating layer.

For the person skilled in the art it is easy to understand that the steps denoted as possible are to be carried out in each case dependent upon which of the (possibly preferred) embodiments of the layer system are to be produced during the process.

In particular it is preferred in step d) that the layer from hardenable elastomer material is partially hardened, so that it can optimally fulfil its functions and after being brought into contact with the wafer surface (promoted by the plasma polymer separating layer) it can be through hardened.

Part of the invention is also a method for producing a wafer support arrangement according to the invention, comprising the steps:
a) production of a wafer,
b) production of a layer system according to the invention, wherein, if the layer system produced comprises a plasma polymer separating layer, the separating layer is configured so that the adhesive bond between the support layer system and the separating layer after the support layer system is bonded to the wafer, wherein the bonding is promoted by the separating layer, and the through hardening of the elastomer material will be greater than the adhesive bond between the wafer and the separating layer,
c) possible removal of the protective foil from the layer system,
d) if the layer system produced does not comprise a plasma polymer separating layer, deposition of such a layer on the wafer or on the layer from elastomer material, so that the adhesive bond, between the support layer system and the separating layer after the support layer system is bonded to the wafer, wherein the bonding is promoted by the separating layer, and the through hardening of the elastomer material, will be greater than the adhesive bond between the wafer and the separating layer,
e) bonding of the layer system to the wafer possibly coated with a plasma polymer separating layer and
f) through hardening of the elastomer material.

It is crucial with the methods described according to the invention that the person skilled in the art selects the choice of the materials for the individual layers considering the factors mentioned further above in particular with respect to their function. Also the degree of hardening of the elastomer material, preferably firstly by partial hardening and subsequent through hardening, the person skilled in the art will adapt to the respective requirements.

It is still to be remarked that various options for producing and bonding the individual layers are available to the person skilled in the art. Thus laminating can be carried out for example by thermo compression, gluing or chemical bonding, wherein the conditions described further above with respect to the adhesive bond of the layers to each other must be met, so that the layers can fulfil their functions according to the invention.

Also for producing the layers, depending upon the choice of materials, various options are available to the person skilled in the art, thus for example layers can be applied firstly as liquid by way of suitable spin or spray coating processes for applying liquid materials, but they can from the start also be applied in the form of a foil. If the functions of the layers specified above are not impaired, the use of adhesion-promoting or adhesion-reducing substances is also possible and depending upon the function of the layer to be achieved is also expedient.

Part of the invention is also a method for processing the rear side of a wafer, comprising the steps:
a) production of a wafer support arrangement according to the invention, which (still) does not comprise a connecting material layer and has no second support layer on the rear side of the wafer, and
b) processing of the rear side of the wafer.

Preferably in the latter method according to the invention the rear side of the wafer is thinned. This can be achieved by conventional methods for example grinding, polishing, honing or etching.

Of course other measures are also clearly possible for processing the rear side of the wafer on the basis of the wafer support arrangement according to the invention, these include for example metallizing of the rear side, structuring of the rear side by means of etching and doping of the rear side.

For the person skilled in the art it is immediately comprehensible that many steps of the method according to the invention can also be carried out under vacuum conditions. This applies preferably to bonding (in particular thermo compression) of the layer from elastomer material to the wafer, wherein it is immaterial whether the plasma polymer separating layer, which is provided between wafer and the layer from elastomer material, at the time of contact is located on the wafer or on the layer from elastomer material.

A method according to the invention according to the invention is preferred, wherein a connecting material layer and a second support layer are applied after the wafer rear side has been successfully processed.

Of course the last-mentioned layers are applied in such a way that the adhesive bond of these layers to each other and to the wafer is greater than the adhesive bond between the wafer and the plasma polymer separating layer.

Accordingly a method according to the invention for processing the rear side of a wafer is preferred wherein after step b) and possibly after step c) separation takes place between the wafer and the plasma polymer separating layer.

This method is particularly preferred if the support layer is a less flexible layer, for example a glass plate. In particular if a second support layer is used, which is more flexible than the support layer, the wafer can be easily separated from the separating layer according to the preferred method according to the invention as described below:

The support layer is fixed on its side turned away from the wafer. This can take place for example in particular with glass plates as the support layer by suction under vacuum. For example mechanical retention by clamping is also possible. Now the second support layer, which is preferably provided in the form of a foil, is lifted by means of a suitable device. Such a device for example can be a reverse roller, which is designed with respect to its radius so that when the system consisting of wafer connecting material layer and second support layer is bent only forces, which render improbable or even rule out damage to the wafer due to mechanical stress, affect the wafer. It is naturally easy to understand that the more the wafer is thinned, that is to say the thinner it is, the more bending it tolerates.

By lifting the system consisting of second support layer, connecting material layer and wafer, separation takes place along the predetermined break point between plasma polymer separating layer and wafer. As already indicated this separation preferably takes place mechanically. For example the advance speed can be selected in such a way that if a reverse roller is used the wafer is not overstressed, but the plasma polymer separating layer is completely removed from the wafer. After separation the wafer front is present without the layer system applied for processing and can be processed further if required.

A method according to the invention is preferred, wherein after the wafer has been separated from the separating layer the second support layer is also separated. This happens preferably by reducing the adhesion between the connecting material layer and the wafer. In the case of an adhesive, which for example reduces or loses its adhesive effect by UV radiation or thermal energy, the adhesion is decreased by UV radiation or the supply of thermal energy. This is also part of a preferred method according to the invention.

Furthermore a method according to the invention is preferred, wherein the wafer is sliced before removal of the plasma polymer separating layer and/or before removal of the second support layer. This can take place for example by dividing the wafer into microchips (dies) after the plasma polymer separating layer has been separated by means of suitable methods (in this connection see for example above). However corresponding division can also take place before the second support layer has been applied while the plasma polymer separating layer still adheres to the wafer.

The advantage of this method is that the sliced wafer (this actually means its sliced parts), is held together as long as it is still in contact with the support layer or the second support layer, thus the individual dies are held by the respective layer system. For the person skilled in the art it is naturally comprehensible that it is expedient in many cases not to divide the respective layer system or at least not completely when slicing the wafer.

More indications are given below in connection with the method according to the invention and production of the wafer support arrangement according to the invention or the layer system according to the invention:

Use of a Liquid Precursor:

As already described in WO 2004/051708 A2, the use of a liquid precursor can be expedient for adjusting the adhesive properties (de-adhesive properties, separation characteristics) of the plasma polymer layer. In the context of the present invention especially mixtures of silicone oil with a corresponding solvent are suitable as a liquid precursor.

The liquid precursor for example can be applied to the wafer by means of spin coating or spray coating, wherein the wafer is rotated in each case, flooding, wherein the wafer surface is flooded from above with the precursor, or dipping, wherein the wafer is dipped into the precursor (possibly with foil-covered rear side).

It is advantageous for many applications to apply the precursor to the wafer in such a way that a thicker precursor layer is applied in the region of critical undercuts or at places, which can be exposed to particularly high shear effects during separation between wafer and plasma polymer separating layer.

The precursor is possibly cross-linked as described in the aforementioned published unexamined patent, which can also take place by means of the plasma when the plasma polymer separating layer is deposited. If the precursor layer is deposited more heavily (more thickly) in some places, the deposition method or the cross-linking method can be configured in such a way that in the particularly critical places the precursor is not or not completely cross-linked. It is therefore still present for example: as oil or in a partially cross-linked form and in the particularly critical places additionally reduces the adhesion between wafer surface and separating layer. Thus separation between wafer and separating layer is once again facilitated especially in topographically critical places.

After the precursor has been applied it may be preferred to let the solvent evaporate (if the precursor comprises a solvent). This can take place for example by suctioning off the solvent vapours, placing in a vacuum chamber or under thermal assistance by heating.

Elastomer Material:

Preferred elastomer materials are silicone-based elastomers for example self-adhesive liquid silicone rubber supplied by Wacker, Burghausen, type ELASTOSIL LR 3070 or LR 3070. Alternatively however rubber, India rubber or other materials with elastomer properties in the through hardened condition can be used. Of course suitable mixtures or laminate composites of different elastomer materials can also be used.

The layer from elastomer material is naturally adapted to its Shore-A-hardness both in the partially hardened and in the through hardened condition for its respective function (see above). For this purpose suitable materials and options are available to the person skilled in the art. If the wafer to be processed for example possesses bumps on its surface, which for example have a height of 50 µm, a Shore-A-hardness of between 20 and 60 is advantageous. Of course it is clear to the person skilled in the art that the thickness of the layer from elastomer material must exceed the height of the bumps sufficiently.

The layer from hardenable elastomer material can be applied for example by scraper blades. This layer can be cross-linked as already described above in multiple steps (partial hardening, through hardening). For example the silicone India rubbers supplied by Wacker, Burghausen specified above, can be vulcanised and therefore cross-linked/through hardened by thermo compression at 165° C. within 5 minutes.

Similar to partial cross-linking, temporary solidification of the layer from elastomer material is also conceivable, for example by chilling or freezing. These processes can also be used as already proposed above for interrupting the through hardening reaction (cross-linking reaction). Preferably corresponding chilling takes place in a dry atmosphere, possibly under an inert gas atmosphere, in order to prevent the ingress of air humidity.

If the layer from elastomer material has been chilled, heating/thawing out for example is expedient under an inert gas atmosphere during or before this layer is brought into contact with the wafer surface (for example by thermo compression).

Laminating:

Laminating can take place by means of a bonder, wherein the parameters of vacuum, temperature, UV radiation, pressure or duration of lamination are adjusted depending on the particular requirement and/or are selected by the person skilled in the art.

Layer Thickness Adjustment of the Layer from Elastomer Material:

This can take place preferably by means of a mechanical stop and/or parallel movement of the two pressure plates of a bonder.

It may be expedient to check the thickness (height) of the wafer support arrangement according to the invention for quality assurance purposes.

Second Support Layer:

Sawing foils can be used as a second support layer, preferably such which possess expansion characteristics (also known as bluetape). Such sawing foils are sold by manufacturers such as Lintec, Nitto or Advantek. Preferably foils produced by Advantek with a glue layer, for example such with a pressure sensitive adhesive (for example type DX112A) or UV sensitive adhesive (for example type DU099D) are used as a second support layer. The adhesion of this sawing foil as a second support layer amounts to 700 g, measured according to the ASM D 1000 method. Under consideration of this adhesive force, separation between plasma polymer separating layer and wafer is possible by exerting tensile force on the second separating layer (also see below).

In this context it is important that the adhesion force (possibly promoted by the connecting material layer) of the wafer to the second support layer is sufficient that it exceeds the adhesion force of the wafer to the separating layer (also including the mould-releasing forces, as they arise for example when bumps are released from the mould). If the second support layer consists of a sawing foil of the type DU099D, the adhesion can be reduced by UV irradiation from the original 700 g to 20 g, measured according to the ASM D 1000 method, and therefore separation of the second support layer from the wafer can be prepared.

The invention is described in more detail below on the basis of drawings and an example. Naturally the invention is not limited to the drawings and/or the example.

Figure 1:
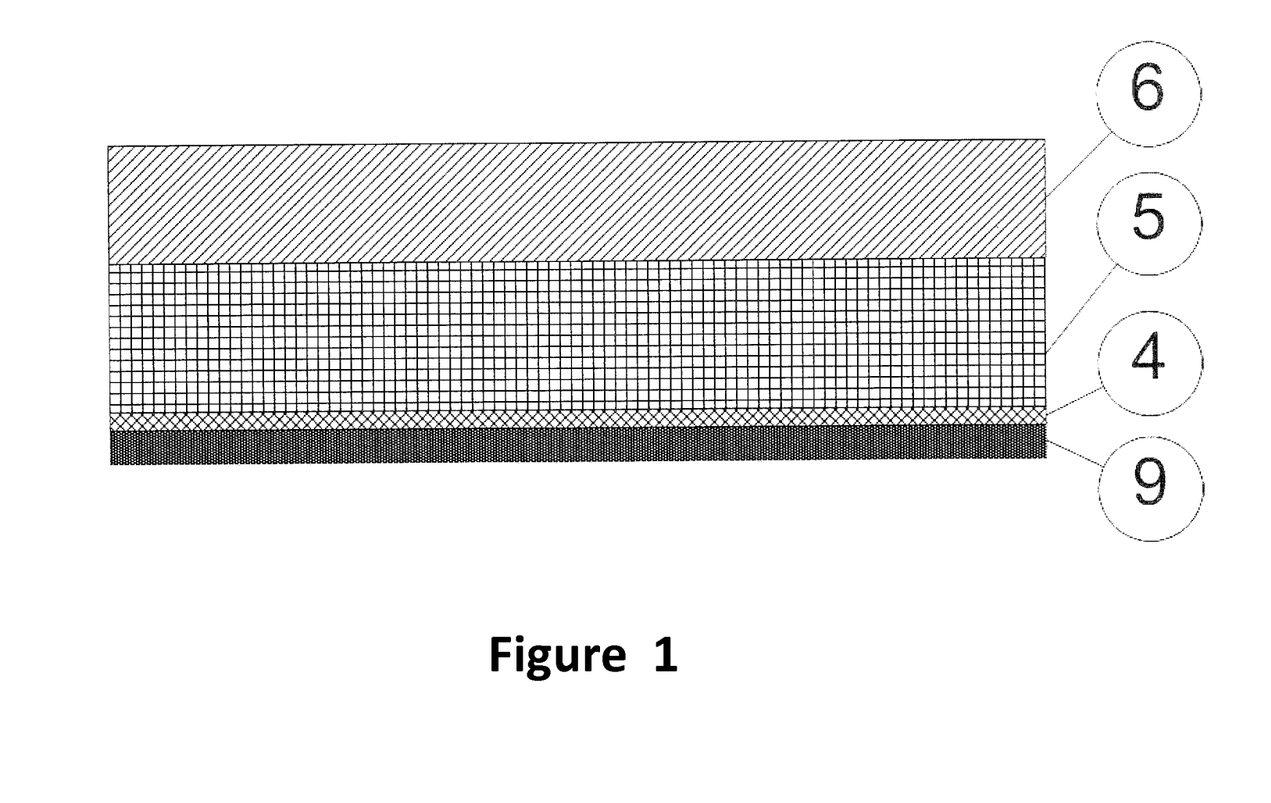
FIG. 1 a layer system according to the invention for a wafer support arrangement, FIG. 2 a wafer support arrangement according to the invention, FIG. 3 a schematic illustration of a possible separation process according to the invention, wherein separation takes place between the wafer and the plasma polymer separating layer.

The layer system according to the invention illustrated in FIG. 1 comprises a separating layer 6, a layer 5 from a through hardened, partially hardened or hardenable elastomer material, a plasma polymer separating layer 4 and a peelable protective foil 9.

Figure 2:
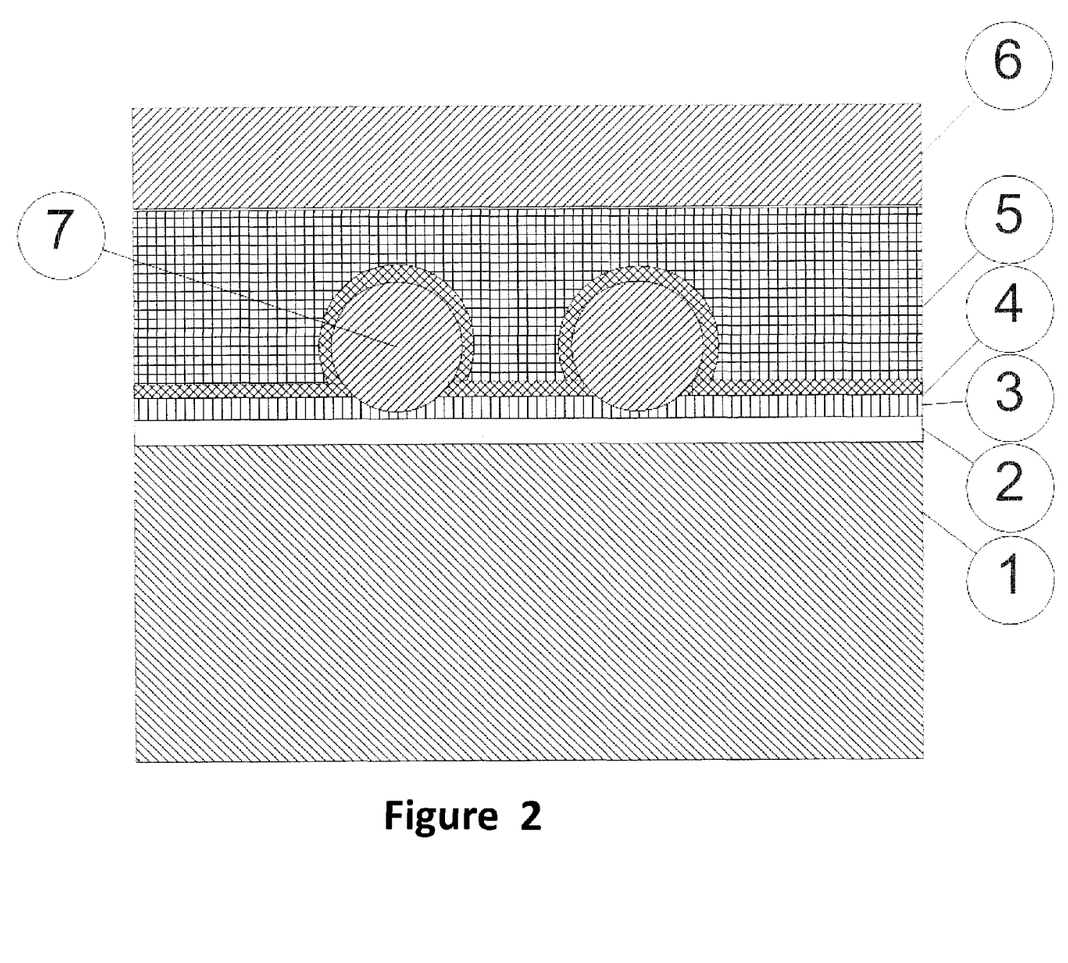

The wafer support arrangement illustrated in FIG. 2 comprises a wafer 1, which comprises an active zone 2 with electronic and/or mechanical functional elements and a passivation layer 3, a plasma polymer separating layer 4, which reproducing its contour covers the surface of the wafer including bumps 7, a layer 5 from hardenable, partially hardened or through hardened elastomer material and a support layer 6.

Figure 3:
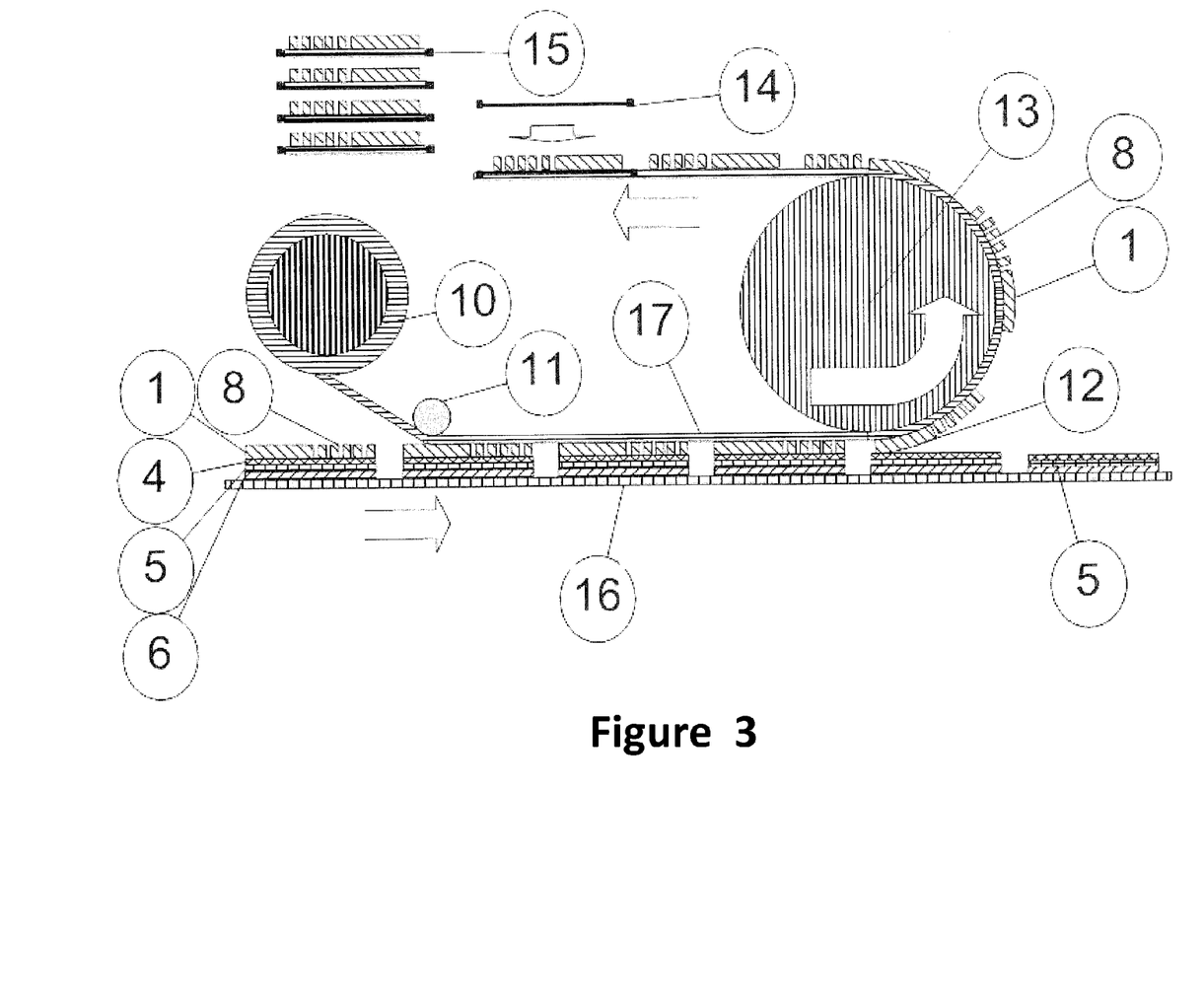

FIG. 3 is a schematic illustration of a separation process according to the invention, wherein the separation takes place between the wafer and the plasma polymer separating layer. In this case wafers 1 are illustrated, which are already partially sliced (8) and on their front are bonded to a plasma polymer separating layer 4, a layer from through hardened elastomer material 5 and a support layer 6. The support layer 6 is preferably a glass plate. The support layer 6 is fixed to a substrate 16 (for example a conveyor). The second support layer 17 is laminated by means of a reverse roller 11 on the rear side of the wafer 1, 8 already thinned by a roller 10. The connecting material layer is not illustrated separately. The second support layer is present as a foil. After lamination the wafer support arrangement produced in such a way is advanced for example by movement of the substrate 16 to a pick-up roller 13, wherein the second support layer 17 is moved 180° across the pick-up roller 13, while the substrate 16 without any change in direction is taken past the pick-up roller. As a result of this arrangement, separation takes place along the point 12 between the plasma polymer separating layer 4 and the wafer 1, 8. The wafer remains adhered to the second support layer 17 and can be subsequently transferred into a frame 14.

The framed foils with the wafer (components) 1, 8, resulting therefrom, correspond to the film frames 15 usual in the semiconductor industry and permit simplified handling and simplified transport. If necessary the wafer 1 or its sliced sections 8 (as microchips) can be removed for further use from the second support layer by reducing the adhesion of the connecting material layer (not illustrated).

EXAMPLE

A 6 inch wafer with a thickness of approx. 700 µm is to be thinned to a thickness of 50 µm, its rear side metallized, tested and afterwards sliced by means of saws. On the front of the wafer there are bumps with a height of 60 µm and a pitch of 150 µm.

The wafer is coated from its front by means of a spray coater manufactured by Süss AG, Garching with a precursor, which consists of 1 part silicone oil of the type AK50 supplied by Wacker, Burghausen and 500 parts isopropanol as the solvent. The spray coater is adjusted so that it ensures the wafer surface is evenly coated with the precursor.

After the wafer is coated by means of spray coating the wafer is brought under a suction device. Under this, the volatile solvent is evaporated and an approx. 120 nm thick layer of silicone oil is left on the wafer surface.

The wafer is now taken to a vacuum chamber. This vacuum chamber is now evacuated, wherein the final traces of solvent evaporate and are suctioned off. Afterwards a plasma polymer separating layer, as disclosed in WO 2004/051708, is deposited on the wafer.

A glass plate with a diameter of 6 inches and a thickness of 2.5 mm is used as a support layer. The glass has a heat expansion coefficient, which at ambient temperature is near that of silicon.

A 300 µm thick layer of a silicone rubber is applied onto one side of the glass plate. The silicone rubber is a material produced by WACKER, Burghausen with the designation ELASTOSIL LR 3070 and a Shore-A-hardness of 50. The material consists of two components and before application must be mixed together in a mixer with a 1:1 ratio. The two-component mixture is now poured onto one side of the glass plate. The glass plate here is sunk in a precision mould. In this case the precision mould topside has a height difference of approx 300 µm from the surface of the upper side of the glass plate. By means of a scraper blade the elastomer material is now distributed in such a way that a homogeneous layer of 300 µm thickness is produced on the glass surface. The redundant amount of elastomer is scraped off. It is advantageous if the materials of the precision mould and the scraper blade are selected in such a way that they only adhere very badly to the elastomer.

The glass plate lying in the precision mould and the layer of the elastomer (silicone rubber) applied are now heated up to approx. 120° C. for a short time and thus the vulcanization process is started in the elastomer (partial hardening). Thus it is achieved that the elastomer is only partially cross-linked and has so much integral adhesive strength that the glass plate can be taken from the precision mould without the layer of the elastomer applied changing shape as a result of its flow behaviour.

If the layer system made of glass plate and elastomer (partially hardened) has to be stored for a longer period, it is now brought to a device, in which it can be chilled down to under minus 50° C. The device here has a nitrogen atmosphere in order to prevent the ingress of humidity in the form of frost.

In addition however the layer system can be used immediately. For this purpose the wafer, with its separating layer applied, as described above, is placed in a bonder manufactured by EVG, Schärding, Austria on a chuck so that its front—that is to say the side, on which the separating layer is located—points upwards. Subsequently the layer system—that is to say the glass plate with elastomer coating—is placed on the wafer surface so that the elastomer layer is in contact with the separating layer. The bonder is now closed and the chamber, in which the wafer with the separating layer and the glass plate with the elastomer layer are now located, is now evacuated by vacuum pump. After reaching a sufficient negative pressure the wafer with the layer system is now compressed by means of two chucks. Void-free positive bonding of the elastomer to the surface of the wafer results. The bumps of the wafer in this case are completely encapsulated by the partially cross-linked mass of the elastomer. By heating the two chucks, which compress the wafer with the support at 165° C., the elastomer is completely cured within 5 minutes (through hardened).

The wafer support arrangement can now be removed from the bonder. As a result of the plane parallelism of the bonder, it is ensured that the thickness of the wafer as well as its support has an inaccuracy of less than 10 μm.

The wafer support arrangement is now placed in a grinder and the free side of the wafer (rear side) is ground so thinly that the wafer has a final thickness of 50 μm.

In order to eliminate any defects which have arisen on the rear side of the wafer during the grinding process, the thinned wafer and the support layer system are placed in a vacuum chamber, in which plasma etching takes place on the polished side of the wafer in order to remove any damage to the surface. Here it is advantageous if the wafer support arrangement briefly tolerates process temperatures of up to 300° C. and if the difference in the thermal expansion behaviour of its components is not too great.

The wafer is subsequently placed in a vacuum chamber and metallized on its free side.

For the purpose of removing the thin and rear side-metallized wafer from the separating layer on the rear side a sawing foil type DU099D supplied by Advantek, is applied by means of a laminating roller. This sawing foil is fixed on its proud side. At the same time the free side of the glass plate is also fixed by means of vacuum suction. The fixed end of the sawing foil is now led around a reverse roller. In this case the reverse roller has a diameter, which is greater than the diameter of a roller, on which the thinned wafer can be placed by bending without breakage caused by overstress.

As a result the thinned wafer separates from the separating layer, with the separating layer remaining on the sides of the glass plate.

The wafer surface is now cleaned by means of a solvent such as Acton and pure water.

The sawing foil (second support layer) is now gripped by means of a frame and can now be taken together with the laminated wafer to a test apparatus. After electrical testing of the wafer and its components by means of contact needles the wafer in a sawing device is sawn by means of abrasive grinding into its components. The sawn wafer thereafter lies on the sawing foil. The foil is expanded and at the same time by exposing the foil to UV radiation the adhesive properties of the foil are reduced in such a way that the individual components can be removed by means of a pick and place device.

SPECIFIC EMBODIMENTS

Specific embodiment one comprises a wafer support arrangement, comprising:
a wafer (1),
a support layer system (5, 6) and
a separating layer (4), which is arranged between the support layer system (5, 6) and the wafer (1),
wherein the support layer system (5, 6)
(i) comprises a support layer (6) and
(ii) a layer (5) from a through hardened, partially hardened or hardenable elastomer material on the separating layer side or consists of these two layers and
wherein the separating layer (4)
(iii) is a plasma polymer layer and
(iv) the adhesive bond between the support layer system (5, 6) and the separating layer (4) after the elastomer material has through hardened is greater than the adhesive bond between the wafer (1) and the separating layer (4).

Specific embodiment two comprises a wafer support arrangement according to specific embodiment one, comprising on the side of the wafer, turned away from the separating layer (4), a connecting material layer and a second support layer (17).

Specific embodiment three comprises a support layer system for a wafer support arrangement according to specific embodiment one or two, comprising
(i) a support layer (6),
(ii) a layer (5) from a through hardened, partially hardened or hardenable elastomer material and
(iii) a peelable protective foil (9) on the side, turned away from the support layer, of the layer from elastomer material.

Specific embodiment four comprises a layer system for a wafer support arrangement according to specific embodiment one or two, comprising
(i) a support layer (6),
(ii) a layer (5) from a through hardened, partially hardened or hardenable elastomer material and
(iii) a plasma polymer separating layer (4) on the side, turned away from the support layer, of the layer from elastomer material.

Specific embodiment five comprises a layer system according to specific embodiment four, comprising a peelable protective foil (9) on the side, turned away from the support layer (6), of the plasma polymer separating layer (4).

Specific embodiment six comprises a wafer support arrangement according to specific embodiment one or two or layer system according to any one of specific embodiments three to five, wherein the elastomer material is partially hardened.

Specific embodiment seven comprises a wafer support arrangement according to any one of specific embodiments one, two, or six or layer system according to any one of specific embodiments three to six, wherein the elastomer material in the partially hardened condition possesses a significantly lower Shore-A-hardness than in the through hardened condition and/or in the through hardened condition possesses a Shore-A-hardness from 15 to 78.

Specific embodiment eight comprises a wafer support arrangement according to any one of specific embodiments one, two, six, or seven or layer system according to any one of specific embodiments three to seven, wherein the elastomer material is produced on a silicone basis or on the basis of a material, with respect to its characteristics, similar to silicone.

Specific embodiment nine comprises a wafer support arrangement according to any one of specific embodiments one, two, or six to eight or layer system according to any one of specific embodiments three to eight, wherein the support layer (6) is a polyimide or a polyamide layer, preferably in the form of a Capton or Ultem foil, a glass layer or a silicon layer.

Specific embodiment ten comprises a wafer support arrangement according to any one of specific embodiments one, two, or six to nine, wherein the heat expansion coefficient for the linear expansion of the support layer (6) deviates from that of the wafer (1) by maximum $10*10^{-6}/° C$.

Specific embodiment eleven comprises a wafer support arrangement according to any one of specific embodiments two or six to ten, wherein the second support layer (17) is a foil.

Specific embodiment twelve comprises a wafer support arrangement according to any one of specific embodiments two or six to eleven, wherein the pliancy of the second support layer (17) is greater than that of the support layer (16).

Specific embodiment thirteen comprises a wafer support arrangement according to any one of specific embodiments two or six to twelve, wherein the second support layer (17) is a foil consisting of one or more layers of PP, PE, PET and/or other plastics.

Specific embodiment fourteen comprises a wafer support arrangement according to any one of specific embodiments two to six to thirteen, wherein the connecting material layer comprises a material, preferably an adhesive, or consists of this, which reduces or loses its adhesion to the wafer under the effect of radiation and/or heat.

Specific embodiment fifteen comprises a wafer support arrangement according to any one of specific embodiments one, two, or six to fourteen or layer system according to any one of specific embodiments three to eight, wherein the support layer (6) and/or the layer (5) from elastomer material and/or the second support layer (17) are configured so that they can be electrostatically charged and/or can be fixed by electrostatically charged surfaces.

Specific embodiment sixteen comprises a layer system according to specific embodiment three or five, wherein the protective foil (9) is a foil consisting of PP, PE, PET and/or another plastic or a paper coated with silicone.

Specific embodiment seventeen comprises use of a layer (5) from a through hardened elastomer material and a plasma polymer separating layer (4) and/or a layer system according to any one of specific embodiments three to eight, fifteen or sixteen and/or a wafer support arrangement according to any one of specific embodiments one or six to ten or fifteen for processing the rear side of a wafer (1), preferably for thinning and/or slicing a wafer (1).

Specific embodiment eighteen comprises a use of a layer system according to any one of specific embodiments three to eight, fifteen, or sixteen to produce a wafer support arrangement according to any one of specific embodiments one, two, or six to fifteen.

Specific embodiment nineteen comprises a method for producing a layer system according to any one of specific embodiments three to eight, fifteen, or sixteen, comprising the steps:
a) formation of a support layer (6),
b) formation of a layer (5) from hardenable elastomer material,
c) bonding of the layers produced in step a) and b), preferably at the same time with step a) or b),
d) possible through hardening or partial hardening of the layer (5) from hardenable elastomer material,
e) possible deposition of a plasma polymer separating layer (4) on the side, turned away from the support layer (6), of the layer (5) from elastomer material and
f) possible application of a peelable protective foil (9) on the side, turned away from the support layer (6), of the layer (5) from elastomer material or on the side, turned away from the support layer (6), of the plasma polymer separating layer (4).

Specific embodiment twenty comprises a method for producing a wafer support arrangement according to any one of specific embodiments one, six to ten or fifteen, comprising the steps:
a) production of a wafer (1),
b) production of a layer system according to any one of specific embodiments three to eight, fifteen or sixteen, wherein, if the layer system produced comprises a plasma polymer separating layer (4), the separating layer (4) is configured, so that the adhesive bond between the support layer system (5, 6) and the separating layer (4) after the support layer system (5, 6) is bonded to the wafer (1), wherein the bonding is promoted by the separating layer (4) and the through hardening of the elastomer material, will be greater than the adhesive bond between the wafer (1) and the separating layer (4),
C) possible removal of the protective foil (9) from the layer system,
d) if the layer system produced does not comprise a plasma polymer separating layer (4), deposition of such a layer (4) on the wafer (1) or on the layer (5) from elastomer material, so that the adhesive bond between the support layer system (5, 6) and the separating layer (4) after the support layer system (5, 6) is bonded to the wafer (1), wherein the bonding is promoted by the separating layer (4), and the through hardening of the elastomer material, will be greater than the adhesive bond between the wafer (1) and the separating layer (4),
e) bonding of the layer system to the wafer possibly coated with a plasma polymer separating layer (4) and
f) through hardening of the elastomer material.

Specific embodiment twenty-one comprises a method for processing the rear side of a wafer (1), comprising the steps:
a) production of a wafer support arrangement according to any one of specific embodiments one, six to the or fifteen, wherein the layer system is applied to the front of the wafer (1), and
b) processing of the rear side of the wafer (1).

Specific embodiment twenty-two comprises a method according to specific embodiment twenty-one, wherein the rear side of the wafer (1) is thinned in step b).

Specific embodiment twenty-three comprises a method according to specific embodiment twenty-one or twenty-two, wherein as step c) after step b) on the rear side of the wafer (1) a connecting material layer and a second support layer (17)

are applied, so that a wafer support arrangement according to any one of specific embodiments two or six to fourteen is created.

Specific embodiment twenty-four comprises a method according to any one of specific embodiments twenty-one to twenty-three, wherein as step d) after step b) and possibly after step c) separation takes place between the wafer (1) and the plasma polymer separating layer (4).

Specific embodiment twenty-five comprises a method according to specific embodiment twenty-four, wherein the separation takes place mechanically.

Specific embodiment twenty-six comprises a method according to either of specific embodiments twenty-four and twenty-five, wherein subsequently as step e) separation takes place between wafer (1) and the connecting material layer possibly with alteration of the connecting material layer.

Specific embodiment twenty-seven comprises a method according to specific embodiment twenty-six, wherein the separation takes place using UV radiation and/or thermal energy.

Specific embodiment twenty-eight comprises a method according to any one of specific embodiments twenty-one to twenty-seven, wherein the wafer (1) is sliced before step c) and/or before step e).

It is claimed:

1. A wafer support arrangement comprising:
   A. a support layer;
   B. a curable elastomer material layer on the support layer;
   C. a plasma polymer separating layer on the curable elastomer material layer; and
   D. a wafer attached to the plasma polymer separating layer;
      wherein the attachment between (A), (B), and (C) after the (B) curable elastomer material has been through hardened, is stronger than the attachment between (C) and (D).

2. The wafer support arrangement according to claim 1, further comprising:
   E. a connecting material; and
   F. a second support layer attached to the side of the wafer opposite the side attached to (C) the plasma polymer separating layer by (E) the connecting material.

3. The wafer support arrangement according to claim 2, wherein (F) the second support layer is a foil.

4. The wafer support arrangement according to claim 3, wherein the foil comprises one or more layers of PP, PE, and PET.

5. The wafer support arrangement according to claim 1, wherein the elastomer material is a silicone.

6. The wafer support arrangement according to claim 1, wherein the (A) support layer is a polyimide or a polyamide layer, a glass layer, or a silicon layer.

7. The wafer support arrangement according to claim 1, wherein the heat expansion coefficient for the linear expansion of the (A) support layer deviates from that of the (D) wafer by maximum of $10*10^{-6}/°C$.

8. The wafer support arrangement according to claim 2, wherein the pliancy of the (F) second support layer is greater than that of the (A) support layer.

9. The wafer support arrangement according to claim 2, wherein the (E) connecting material layer reduces or loses its adhesion to the wafer under the effect of radiation and/or heat.

10. The wafer support arrangement according to claim 2, wherein the (A) support layer and/or the (B) curable elastomer material and/or the (F) second support layer are configured so that they can be electrostatically charged and/or can be fixed by electrostatically charged surfaces.

11. The wafer support arrangement according to claim 2, wherein the connecting material layer comprises an adhesive, which reduces or loses its adhesion to the wafer under the effect of radiation and/or heat.

12. A method for producing a wafer support arrangement according to claim 1 comprising
   1. combining:
      A. a support layer;
      B. a curable elastomer material layer on the support layer; and
      C. a plasma polymer separating layer on the curable elastomer material layer; and
   2. attaching:
      D. a wafer to the (C) plasma polymer separating layer; and
   3. curing the curable elastomer material layer so that the attachment between (A) the support layer, (B) the curable elastomer material layer, and (C) the plasma polymer separating layer is stronger than the attachment between (C) the plasma polymer separating layer and (D) the wafer.

13. The method according to claim 12, further comprising:
   4. thinning the side of the wafer opposite to the (A) support layer.

14. The method according to claim 13, further comprising:
   5. applying (E) a connecting material layer and (F) a second support layer to the side of the wafer opposite to the (A) support layer.

15. The method according to claim 14, further comprising:
   6. separating the (D) wafer and the (C) plasma polymer separating layer.

16. The method according to claim 15, wherein the separation takes place mechanically.

17. The method according to claim 15, wherein separation takes place using UV radiation and/or thermal energy.

18. The method according to claim 12, further comprising:
   4. slicing the wafer.

19. A wafer support arrangement comprising:
   A. a support layer;
   B. a silicon curable elastomer material layer on the support layer;
   C. a plasma polymer separating layer on the curable elastomer material layer;
   D. a wafer attached to the plasma polymer separating layer;
   E. a connecting material; and
   F. a second support layer attached to the side of the wafer opposite the side attached to (C) the plasma polymer separating layer by (E) the connecting material;
      wherein the attachment between (A), (B), and (C) after the (B) curable elastomer material has been through hardened, is stronger than the attachment between (C) and (D).

* * * * *